United States Patent
Franz et al.

(10) Patent No.: US 9,057,378 B2
(45) Date of Patent: Jun. 16, 2015

(54) INTELLIGENT AIR MOVING APPARATUS

(71) Applicant: HEWLETT-PACKARD DEVELOPMENT COMPANY, L.P., Houston, TX (US)

(72) Inventors: John P. Franz, Houston, TX (US); Wade D. Vinson, Magnolia, TX (US); Thomas D. Rhodes, The Woodlands, TX (US); David F. Heinrich, Tomball, TX (US); Stephen A. Kay, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/653,709

(22) Filed: Oct. 17, 2012

(65) Prior Publication Data

US 2013/0037250 A1 Feb. 14, 2013

Related U.S. Application Data

(62) Division of application No. 12/107,140, filed on Apr. 22, 2008, now abandoned.

(60) Provisional application No. 60/943,679, filed on Jun. 13, 2007.

(51) Int. Cl.
*F04D 27/00* (2006.01)
*G06F 1/20* (2006.01)
*H05K 7/20* (2006.01)

(52) U.S. Cl.
CPC ............ *F04D 27/004* (2013.01); *F04D 27/008* (2013.01); *G06F 1/20* (2013.01); *H05K 7/20209* (2013.01)

(58) Field of Classification Search
CPC .............. F04D 27/0004; F04D 27/008; F05K 7/20209; G06F 1/20
USPC ............... 417/18, 22, 32, 44.1, 44.11, 45, 63; 700/282
See application file for complete search history.

(56) References Cited

U.S. PATENT DOCUMENTS

| 4,656,553 | A | | 4/1987 | Brown | |
|---|---|---|---|---|---|
| 5,790,430 | A | * | 8/1998 | Steiert | 340/648 |
| 6,147,465 | A | * | 11/2000 | Hollenbeck | 318/400.26 |
| 6,199,528 | B1 | * | 3/2001 | Hotta et al. | 123/142.5 E |
| 6,270,319 | B1 | | 8/2001 | Lyszkowski et al. | |

(Continued)

FOREIGN PATENT DOCUMENTS

JP 2004198029 A * 7/2004 .............. F24F 11/02

OTHER PUBLICATIONS

U.S. Appl. No. 13/243,369, Examiner's Answer mailed on Jun. 21, 2013, 23 pages.

(Continued)

*Primary Examiner* — Charles Freay
*Assistant Examiner* — Philip Stimpert
(74) *Attorney, Agent, or Firm* — Hewlett-Packard Patent Department

(57) ABSTRACT

An intelligent air moving apparatus for cooling an electronics enclosure includes a motor for driving a fan at a variable rotational speed and a microcontroller for controlling the rotational speed of the motor. The microcontroller includes a speed sensor for sensing the rotational speed such that when the sensed rotational speed deviates below a target speed, the microcontroller detects a locked rotor condition.

19 Claims, 2 Drawing Sheets

(56) References Cited

U.S. PATENT DOCUMENTS

| | | | |
|---|---|---|---|
| 6,545,438 B1 * | 4/2003 | Mays, II | 318/400.01 |
| 6,592,449 B2 | 7/2003 | Cipolla et al. | |
| 6,597,144 B2 * | 7/2003 | Pearson et al. | 318/599 |
| 6,954,684 B2 | 10/2005 | Frankel et al. | |
| 7,002,311 B2 * | 2/2006 | Strike et al. | 318/400.13 |
| 7,305,316 B2 * | 12/2007 | Frankel et al. | 702/99 |
| 2002/0030113 A1 * | 3/2002 | Abuzeid et al. | 236/4 |
| 2003/0234625 A1 | 12/2003 | Frankel et al. | |
| 2005/0237717 A1 * | 10/2005 | Babb et al. | 361/697 |
| 2007/0089011 A1 * | 4/2007 | Dodeja et al. | 714/742 |
| 2007/0110558 A1 | 5/2007 | Chen et al. | |
| 2007/0116553 A1 | 5/2007 | Chen et al. | |
| 2007/0116577 A1 * | 5/2007 | Chen et al. | 417/7 |
| 2007/0145920 A1 * | 6/2007 | Wu et al. | 318/268 |

OTHER PUBLICATIONS

U.S. Appl. No. 13/243,369, Final Office Action mailed Mar. 4, 2013, 19 pages.

U.S. Appl. No. 13/243,369, Non-Final Office Action mailed Aug. 6, 2012, 13 pages.

* cited by examiner

INTELLIGENT AIR MOVING APPARATUS

CROSS-REFERENCE TO RELATED APPLICATIONS

This application is a divisional of U.S. patent application Ser. No. 12/107,140, filed Apr. 22, 2008, entitled "Intelligent Air Moving Apparatus" and claims priority of U.S. Provisional Application No. 60/943,679, filed Jun. 13, 2007, entitled "Intelligent High Performance Air Mover." The content of the related applications are incorporated herein by reference in their entirety.

BACKGROUND

Fans powered by electric motors are commonly used to cool computer servers and other electronic equipment within an electronics enclosure. Existing electronics enclosure cooling fans have limited intelligence and provide little or no communication to an infrastructure controller capable of monitoring the electronics systems the fans are designed to cool. Therefore, existing fans lack the ability to be optimized for thermal performance, noise, power consumption, reliability, maintenance and warranty costs, and other relevant parameters.

In typical computing systems, including computer servers, multiple fans are required to maintain sufficient airflow to cool the electronics equipment within the enclosure. Further, the multiple fans must be able to operate effectively and harmoniously in conjunction with each other. Therefore, limited intelligence fans require substantial amounts of computational overhead to ensure the fans are operating to provide adequate cooling, and to detect fan failures before the electronics equipment overheats.

BRIEF DESCRIPTION OF THE DRAWINGS

The accompanying drawings illustrate embodiments of an intelligent air moving apparatus as described herein.

In the drawings.

DETAILED DESCRIPTION

Figure 1:
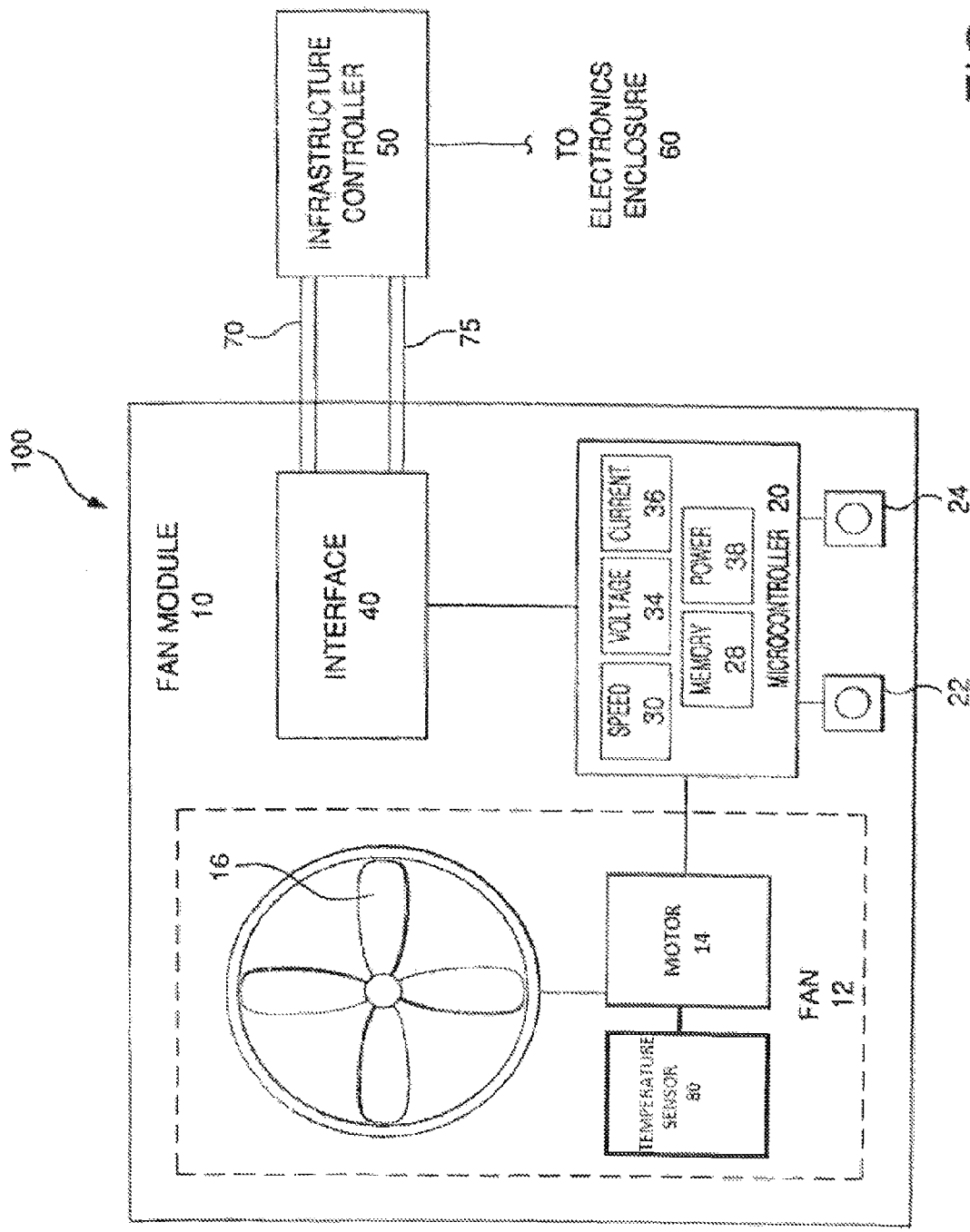
FIG 1 shows a schematic view of a fan module interconnected to an infrastructure controller.

There is shown in FIG 1 an air moving apparatus 100 comprising a fan module 10 interconnected to an infrastructure controller 50. The infrastructure controller 50 is further interconnected to an electronics enclosure 60 to monitor various operational parameters including temperature of the electronics enclosure 60. The fan module 10 comprises a fan 12, a microcontroller 20, and an interface 40. The fan 12 has a motor 14 adapted to drive a fan blade 16 at a variable rotational speed, as commanded by the microcontroller 20, to accommodate the cooling needs of the electronics enclosure 60. The microcontroller 20 controls the speed of the motor 16 and includes a speed sensor 30 to sense the motor rotational speed and to provide a feedback signal of the actual motor speed. The microcontroller can additionally include other sensors, such as a voltage sensor 34, and a current sensor 36. In an embodiment, the microcontroller 20 receives instructions from the infrastructure controller 50 and sends fan status information to the infrastructure controller 50 via the interface 40.

The microcontroller 20 can be a microprocessor. Alternatively, the microcontroller functions can be performed by solid state components or other circuitry. An exemplary microcontroller is commonly known as a Programmable Interface Controller or Programmable Intelligent Computer ("PIC"), an inexpensive chip-based programmable microcontroller. The term "PIC" is used interchangeably with the term "microcontroller" in this application. The microcontroller 20 includes a memory 28 for storing data.

The microcontroller 20 includes features to allow the fan module 10 to assess its own status. The microcontroller 20 further is adapted to communicate information regarding operation of the fan module 10 to the infrastructure controller 50 to facilitate efficient and quiet cooling provided by the fan 12 to the electronics equipment 60. The microcontroller 20 can reduce power consumption and noise generation by the fan module 10, and can increase reliability of the fan 12, optimizing the fan 12 to operate at a level adequate to ensure adequate cooling of the electronics equipment 60 rather than having to operate at a margin of safety above such a level.

Precise Speed Control.

In order to optimize fan module performance, the microcontroller 20 includes a feedback control loop and a speed control algorithm for precisely regulating the rotational speed of the motor 14. In one embodiment, a DC motor is used and motor speed is controlled by pulse-width modulation (PWM). The speed is controlled to a target speed that can be a preprogrammed speed, a speed setpoint received from the infrastructure controller 50, or a default speed at which the fan motor 14 operates in the event of a communication failure between the infrastructure controller 50 and the fan module 10. The default speed can be the most recent target speed received from the infrastructure controller 50 or a preset default speed stored in the memory 28 of the microcontroller 20. The control loop detects the actual rotational speed of the motor 14 as measured or sensed by the speed sensor 30 and the algorithm compares the actual speed to the target speed. The motor rotational speed can be measured periodically over various time spans depending on the accuracy of control required. When the measured speed of the motor 14 deviates from the target speed by at least a preset tolerance, the algorithm adjusts the control signal to the motor 14 to cause the actual motor speed to approach the target speed. Accurate speed control is used to improve power usage and reliability by causing a fan motor 14 to operate only as fast as necessary to achieve the required cooling.

Speed control can also be accomplished by using a temperature sensor 80 measuring fan inlet air temperature changes that may be caused by changes to the ambient conditions of the room or loading of the electronic equipment in the enclosure. A target speed can be set based on the fan inlet temperature detected by the temperature sensor 80. In one example, if the ambient temperature becomes too high (e.g., the room air conditioning fails), the fan can accelerate to a higher speed as required. In another example, if an electrical short causes a visual thermal event (i.e., a fire), the fan can shut down and allow the event to extinguish itself (since most materials in the electronics enclosure are rated to stop burning) rather than aggravating the fire by providing additional air.

In one embodiment, an external crystal oscillator is used to ensure an accurate time base for motor speed measurements. The speed control algorithm can contain optimizations to handle large changes in motor speed settings by attempting to estimate the correct PWM setting for a given motor speed, thereby achieving the target speed faster by making fewer incremental steps. Optimization of the speed control algorithm is particularly useful in the event that the motor speed or target speed changes by a large amount in a short period of time.

Avoidance of Natural and Beat Frequencies.

Providing precise speed control of the motor 14 enables the fan module 10 to avoid natural vibration frequencies. All devices with rotating components, including the fan 12 and fan module 10, have natural vibration frequencies at certain speeds, and often these speeds fall within the range of normal operation. If the device is operated at such speeds, the natural vibration frequencies can cause not only vibrations but also acoustic noise. These natural vibration frequencies can be readily determined, either by theoretical or empirical methods, and correlated with motor speeds, based at least in part on the characteristics of the motor 14, the fan blade 16, and the fan module 10. In an embodiment, speed avoidance data is stored in tables in the memory 28 of the microcontroller 20. The data tables (generally expressed in RPM) establish speed avoidance zones within a predetermined band around each of the natural vibration frequencies. The speed avoidance zone data can be stored in the microcontroller 20 or can be communicated to the microcontroller 20 from the infrastructure controller 50. The microcontroller 20 does not permit the fan 12 to operate within any of the speed avoidance zones. Instead, when cooling requirements call for a speed within a speed avoidance zone, the microcontroller 20 sends the fan motor 14 a speed setpoint that is slightly above or below the prohibited zone, in order to maintain sufficient cooling flow while minimizing power used by the motor 14. The speed setpoint can be outside the avoidance zone by a percentage of the target speed or by a fixed number of RPM, depending on the characteristics of the fan. In one embodiment, the microcontroller 20 controls the fan motor 14 to operate at a speed approximately 100 RPM above or below the speed avoidance zone.

Figure 2:
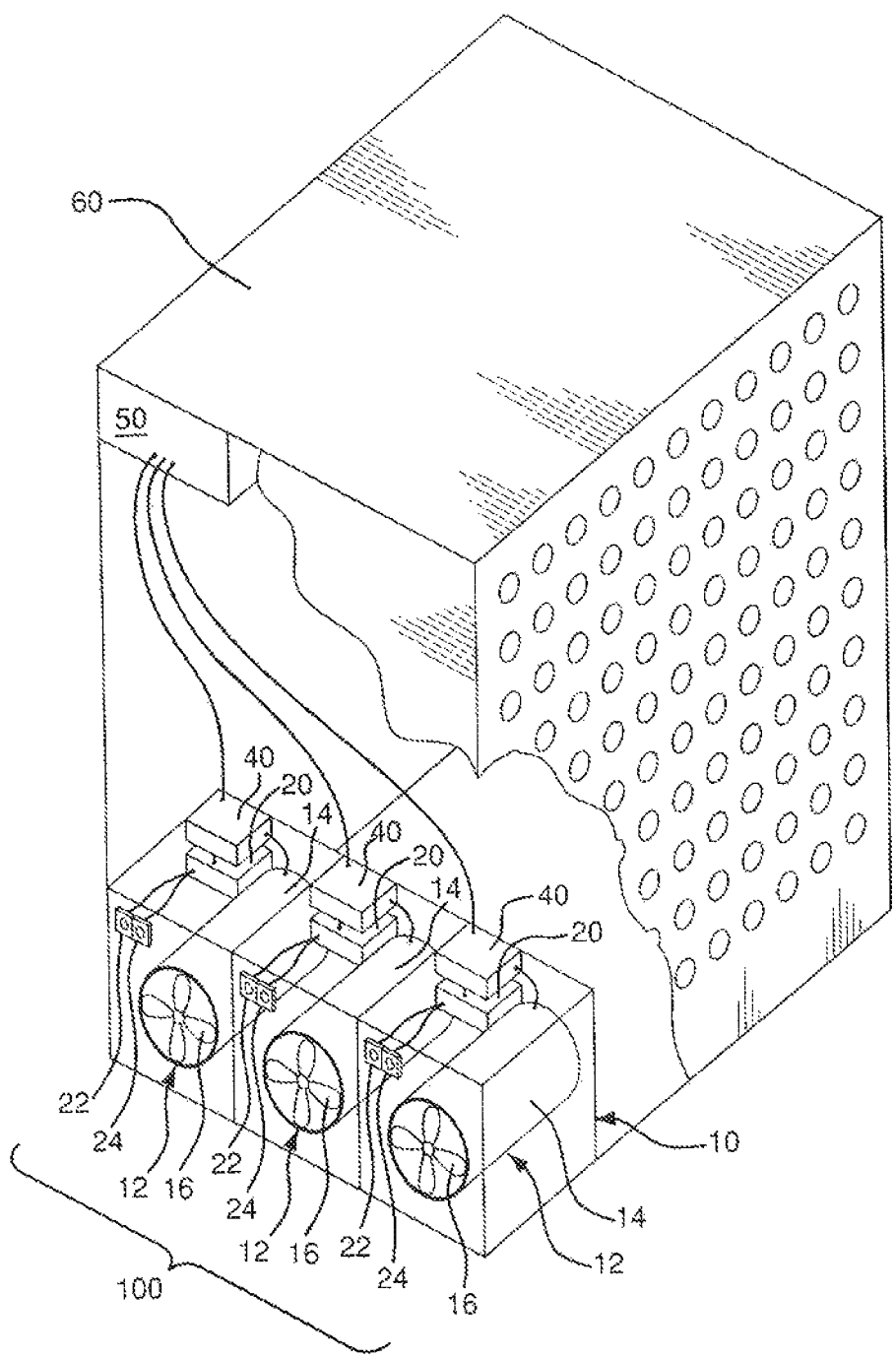
FIG 2 shows an electronics enclosure having a plurality of fan modules mounted thereto for providing cooling.

A system 100 may comprise two or more fan modules 10 operating in conjunction to cool an electronics enclosure 60, as shown in FIG 2. Whenever two similarly sized fans 12 operate nearby each other at similar speeds, there is a potential for beat frequencies to occur. As an extension of the speed avoidance tables, additional speed avoidance zones can be created to avoid such beat frequencies. As with the individual speed avoidance zones, when a target speed is provided to a microcontroller 20 to operate a fan 12 in one of the beat frequency speed avoidance zones, the microcontroller 20 automatically adjusts the rotational speed of the fan 12 to be slightly above the prohibited range in order to prevent unwanted tone resonance and beat frequencies while still achieving at least the minimum speed required to provide proper cooling.

Locked Rotor Protection.

In one embodiment, the fan motor 14 is a conventional DC motor having a stator and a rotor, wherein the fan blade 16 spins along with the rotor while the stator remains stationary with respect to the remainder of the fan 12. If the rotor locks up, the fan blade 16 will not spin and the fan 12 will not be able to deliver cooling. Additionally, a locked rotor can damage the fan 12. There are at least four possible types of locked rotor events that prevent the fan 12 from rotating when it is instructed to rotate by the microcontroller 20: lock-up at startup, lock-up while running at constant speed, lock-up during speed changes, and partial lock-up that creates a drag but does not completely stop the fan blade from spinning. Typically, these events occur when the fan blade 16 is blocked from running due to loose cables or other objects obstructing the fan 12 in one way or another, or due to debris or wear in the bearings of the motor 14.

Some fans in the industry use Hall effect sensors (which sense proper commutation of the motor) to detect situations when a fan is commanded to run but the fan blade or impeller is not spinning as it should. However, in an embodiment in which the fan module 10 is packaged into a very small volume, there is insufficient space for Hall effect sensors. In other embodiments, it may be cost-prohibitive to use Hall effect sensors. Therefore, in order to detect a locked rotor event, the microcontroller 20 employs a speed sensor 30 capable of detecting back electromotive force voltage (back EMF) and correlating the back EMF with fan speed. When the back EMF sensor 30 detects a locked rotor event based on back EMF, a failure alert is generated by the microcontroller 20 and a motor restart sequence is initiated. In an embodiment, the microcontroller 20 is a PIC and this functionality is accomplished by code on the PIC, combined with hardware circuitry. In another embodiment, the microcontroller 20 uses hardware circuitry alone.

Back EMF voltages are tabulated or stored in the memory 28 of the microcontroller 20 for known operating conditions when the fan 12 is operating normally, so they can be compared with voltages measured at various actual operating conditions to detect whether the actual operating conditions have deviated by at least a threshold amount outside normal ranges. The threshold amount can be specified as a percentage of the target speed or as a fixed number of RPM. If such a deviation is detected by the speed sensor 30, a comparator in the microcontroller 20 triggers a restart of the motor 14. Alternatively, the microcontroller 20 can sample the back EMF voltages detected by the speed sensor 30 and code can be used to determine whether the voltage value is normal or abnormal. If abnormal, the microcontroller 20 can instruct the motor 14 to shut down and restart.

In one embodiment, the time to detect a locked rotor condition is dependent upon the target speed of the fan 12, ranging from about 1 second at a high target speed to about 6 seconds at a low target speed. During a shut down and restart, the fan 12 is turned off for about 7 seconds and takes an additional 3-4 seconds to restart. To prevent overheating of the motor 14, the number of restart cycles can be limited, and an alert created when the limit is reached to indicate that the fan 12 needs inspection and/or replacement.

Speed Brake.

Rotating devices such as cooling fans can be dangerous to maintenance or repair personnel. In particular, high performance cooling fans such as the fan 12 can operate at speeds of 18,000 RPM or higher. Therefore, the fan 12 is provided with an electronic speed brake to stop the fan blade 16 from rotating within about one second after when power is removed from the motor 14 or the module 10 is removed, thereby significantly reducing the chance that a service person, tool, or other object will contact rotating fan blades during servicing and/or removal of the fan 12 and/or the fan module 10. The electronic speed brake functions as follows. After power is removed from the motor 14, the voltage sensor 34 senses or detects a corresponding voltage drop indicative of the removal of power. When a predetermined threshold drop in voltage is reached, the microcontroller 20 simultaneously energizes all motor phases, causing the sequenced commutation to stop substantially immediately and thus substantially immediately stopping the fan blades from rotating.

Autonomous Operation.

In one embodiment, the fan module 10 operates autonomously and has intelligence keep the fan 12 running to cool the system even when the microcontroller 20 does not receive a target speed signal from the infrastructure controller 50. Once the fan 12 has been instructed to operate at a rotational speed or RPM setpoint, the fan module 10, through the microcontroller 20 or PIC, is capable of controlling and monitoring its own performance. Therefore, the fan module 10 will maintain the speed of the fan 12 at a target speed. The target speed can be provided by the infrastructure controller 50 or can be stored in the memory 28 of the microcontroller 20.

If the fan 12 is unable to reach or maintain the target speed, the microcontroller 20 communicates an alert signal to the infrastructure controller 50. By having this intelligence built into the fan module 10 as opposed to being centralized in the infrastructure controller 50, the fan 12 can operate to cool the electronics enclosure 60 if the infrastructure controller 50 is not operating or if the fan module 10 loses communication with the infrastructure controller 50. Also, because some electronics enclosures 60 have ten or more cooling fan modules 10, intelligence built into the fan module 10 reduces the computational loading on the infrastructure controller 50.

Sequenced and Gradual Startup.

In a system 100 including multiple fan modules 10, starting two or more fans 12 simultaneously at a desired setpoint speed could result in undesirable power surges. To avoid such power surges, the microcontroller 20 can implement various strategies. In one embodiment, the fans 12 can be started up sequentially. In another embodiment, the fans 12 can be started up at a relatively low speed and then gradually ramped up to the setpoint speed. In yet another embodiment, the fans 12 can be started up sequentially at a relatively low speed and then each fan gradually ramped up to the setpoint speed.

Fan Failure Indicator.

The fan module 10 can include at least one colored light emitting diode (LED) to indicate status conditions of the fan 12. In an embodiment, a green LED 22 and an amber LED 24 are connected to the microcontroller 20. When the fan module 10 is off, i.e., no power is being delivered to the fan 12 and the microcontroller 20 has not been instructed to operate the fan 12, neither LED 22, 24 is illuminated. When power is on and the fan 12 is operating normally, i.e., within a preset range of a target speed, the green LED 22 is illuminated. The present range can be bounded by a percentage of the target speed or by a number of RPM above and/or below the target speed, and can be provided by the infrastructure controller 50 or stored in the memory 28 of the microcontroller 20. When the fan 12 fails to operate, the amber LED 24 is illuminated. Circuitry is included to keep the LED 24 illuminated amber in the event of loss of programming to the microcontroller 20 or corrupted microcontroller memory 28 to help distinguish and diagnose this failure scenario. When an error condition is present that does not prevent the fan 12 from operating, the amber LED 24 blinks. Error conditions can include, but are not limited to, the fan module 10 being installed in an incorrect location, a loss of communication from the infrastructure controller 50 to the fan module 10 (i.e., to the microcontroller 20), and receipt of an override signal. Blinking the amber LED 24 to indicate such conditions helps to diagnose problems prior to an indication from the infrastructure controller 50 of a more serious condition, such as insufficient cooling being provided to the electronics enclosure 60.

Because the microcontroller 20 has the ability to measure both speed of the motor 14 and power drawn by the motor 14, a pre-failure alert can be provided when the microcontroller 20 detects a deviation from the expected relationship between fan speed and power. Such a deviation could be due to bearing wear, debris build-up at the fan inlet, or other conditions requiring attention. Similarly, one or more temperature sensors 80 can be used on the motor 14 to detect deviations from expected normal operating temperatures that can be indicative of impending motor failure.

Interactive Communication.

In one embodiment, the interface 40 is a bi-directional interface through which the fan module 10 can exchange communications with the infrastructure controller 50 via a primary communication link 70. Through the interface 40, the microcontroller 20 communicates operational and other information to enable optimization of fan performance or diagnosis of problems within the fan module 10 in the event of an error condition or failure. The infrastructure controller 50 can instruct the microcontroller 20 to operate the fan 12 at a target rotational speed. Further, the infrastructure controller 50 can read status parameters of the fan 12, as collected by the microcontroller 20 through its various sensors, such as the motor speed and the voltage and current being supplied to the motor 14. The infrastructure controller 50 can also read static and dynamic data stored in the memory 28 of the microcontroller 20. Static data can include identifying information such as spare part numbers, serial numbers, and date of manufacture, as well as operational information such as power-on speed and override PWM setting. Dynamic data can include information such as total hours of motor operation, total revolutions of motor operation, and logged failures or error events (e.g., locked rotor restarts). The infrastructure controller 50 can update the stored data to affect operation of the fan 12, for example to update the speed zone avoidance data and overall speed range settings.

Power Circuit and Overcurrent Protector.

The microcontroller 20 includes a power sensing circuit 38 to measure the power being consumed by the fan 12, thereby enabling the infrastructure controller 50 to monitor and effectively allocate power to the various fan modules 10. The power circuit 38 computes power based on measurements from the voltage sensor 34 and the current sensor 36, and reports dynamic power consumption to the infrastructure controller 50, which tracks power allocation. In addition the power circuit 38 can be used to monitor for impending failures due to bearing wear in the fan motor 14, i.e., to provide a pre-failure notification when the motor 14 is drawing more power than it should for a specified rotational speed.

Conventional power circuits use a "one time" fuse that blows if a threshold current is exceeded. When such a fuse blows, any equipment powered through that fuse ceases to function until the fuse is replaced. In the disclosed embodiment, the power sensing circuit 38 monitors power levels. If the power circuit 38 determines that current being drawn by the fan module 10 is too close to a predetermined shutdown threshold, an overcurrent protector 39 shuts off power while preventing damage to itself. The microcontroller 20 is then able to reset and restart the fan 12, avoiding the need for hardware repair resulting from a high current condition.

Redundant Communication Channels.

In one embodiment, the interface 40 in the fan module 10 uses a bus architecture to provide a communication link 70 to the infrastructure controller 50. In particular, an I2C bus may be used. If the communication link 70 is broken, an alternate signal path 75 is provided from the interface 40 to the infrastructure controller 50. Thus, in the event that the infrastructure controller 50 and interface 40 cannot communicate with one another, the infrastructure controller 50 automatically switches over to the alternate signal path and causes the microcontroller 20 to perform a self diagnostic recovery reset, which in most cases will restore the bus communication link 70 from the infrastructure controller 50 to the interface 40.

As shown in the embodiment illustrated in FIG 2, a system 100 comprising three fan modules 10 is provided. Any number of fan modules 10 can be provided in a system 100.

Because each fan module 10 has an independent microcontroller 20, the fans 12 can be individually controlled to allow fine cooling control and to avoid large current surges caused by changing power states on all fans 12 simultaneously. An infrastructure controller 50 provides control signals to each fan module 10. The fan modules 10 are supplied with 48 VDC and the speed of each fan motor 14 is controlled by a pulse-width modulated (PWM) 5 VDC signal operating at 20 kHz. The speed sensor 30 in each fan module 10 produces a tachometer signal which is used by the microcontroller 20 to determine rotational speed, and cooling capacity can be inferred from the tachometer signal based on the speed versus airflow characteristics of the fan blade 16. In an embodiment, the tachometer signal is produced as an open collector square wave signal four times per revolution of the fan motor 14. If no control signal is received by a particular fan module 10, that module 10 instructs the fan 12 to spin at a default speed. The default speed can be stored in the memory 28 of the microcontroller 20 or can be the most recent target speed provided by the infrastructure controller 50. Each microcontroller 20 generates a fault signal if any one of a number of "error" conditions occurs, and the fault signal is communicated to the infrastructure controller 50 through an interface 40 in the fan module 10.

When installed, each fan module 10 drives a presence signal low, so that if the fan module 10 loses connection with the infrastructure controller 50, the presence signal will go high and the infrastructure controller will be alerted. Each fan module 10 preferably carries in the memory 28 of the microcontroller 20 a unique identifying information (e.g., model and serial numbers) to facilitate tracking of individual fan modules 10. Each fan module memory 28 also records operating characteristics of the fan 12 and stores pre-failure warranty information.

What is claimed is:

1. A method of cooling an electronics enclosure comprising:
   providing at least one fan module, the fan module comprising a multi-phase motor for driving a fan at a variable rotational speed and a microcontroller for controlling the rotational speed of the motor;
   sensing the rotational speed;
   detecting with the microcontroller a locked rotor event when the sensed rotational speed falls below a target speed by at least a threshold amount; and
   providing an alert to indicate recommended inspection of the fan in response to a predetermined plurality of shut down and restart sequences.

2. The method of claim 1, further comprising:
   controlling, with the microcontroller, the rotational speed to be outside one or more speed avoidance zones defined by natural frequencies of the fan module.

3. The method of claim 1, further comprising:
   when more than one fan module is provided, starting the fans in each of the at least one fan modules sequentially instead of simultaneously to avoid power surges.

4. The method of claim 1, further comprising:
   providing a communications interface adapted to receive a target speed signal; and
   maintaining the rotational speed at a default speed when the communications interface detects a loss of the target speed signal.

5. A method of cooling an electronics enclosure comprising:
   providing a plurality of fan modules, each fan module including:
   a multi-phase motor for driving a fan at a variable rotational speed,
   a microcontroller for controlling a rotational speed of the motor based on a measured rotational speed of the motor and a predefined target speed, and
   an interface that connects each of the plurality of fan modules to a centralized infrastructure controller external to the fan module, the interface enables communication between the microcontroller and the centralized infrastructure controller such that the microcontroller autonomously controls the cooling of the fan module;
   determining with the microcontroller, the measured rotational speed;
   optimizing performance of each of the plurality of fan modules using the microcontroller contained within the fan module, the microcontroller compares the measured rotational speed and the predefined target speed stored on the microcontroller; and
   starting the fans in each of the at least one fan modules sequentially instead of simultaneously to avoid power surges; and
   providing an alert to indicate recommended inspection of the fan in response to a predetermined plurality of shut down and restart sequences.

6. The method of claim 5, wherein optimizing performance comprises: adjusting a control signal from the microcontroller to the multi-phase motor.

7. The method of claim 5, further comprising:
   limiting communication with the centralized infrastructure controller.

8. The method of claim 5, further comprising:
   performing computational tasks with the microcontroller of the fan module.

9. The method of claim 5, further comprising:
   storing in memory of the fan module at least one data value comprising a speed avoidance zone.

10. The method of claim 5, further comprising:
    controlling, with the microcontroller, the rotational speed to be outside one or more speed avoidance zones defined by natural frequencies of the fan module; and
    maintaining the rotational speed at a default speed when the communications interface detects a loss of a target speed signal.

11. The method of claim 5, further comprising:
    detecting with the microcontroller a locked rotor event when the measured rotational speed falls below the predefined target speed by at least a threshold amount.

12. A method of cooling an electronics enclosure comprising:
    providing a plurality of fan modules, each fan module including:
    a multi-phase motor for driving a fan at a variable rotational speed,
    a microcontroller for controlling a rotational speed of the motor based on a measured rotational speed of the motor and a predefined target speed,
    an interface that connects each of the plurality of fan modules to a centralized infrastructure controller external to the fan module, the interface enables communication between the microcontroller and the centralized infrastructure controller, and
    a memory connected to the microcontroller and the interface to store data received therefrom;
    determining with the microcontroller, the measured rotational speed;

managing performance of each of the plurality of fan modules using the microcontroller contained within the fan module, the microcontroller compares the measured rotational speed and the predefined target speed stored on the microcontroller such that the microcontroller autonomously controls the cooling of the fan module using data stored in the memory;

measuring a fan air inlet temperature;

automatically shutting down rotation of the fan modules in response to the fan air inlet temperature indicating a visual thermal event; and providing an alert to indicate recommended inspection of the fan in response to a predetermined plurality of shut down and restart sequences.

13. The method of claim 12, wherein managing performance comprises sensing a drop in voltage indicative of removal of power from the multi-phase motor and, based on the sensed drop in voltage, simultaneously energizing all one or more motor phases to stop the motor from rotating.

14. The method of claim 12, further comprising performing computational tasks with the microcontroller of the fan module.

15. The method of claim 12, further comprising:
receiving the predefined target speed from the infrastructure controller; and
storing the predefined target speed in the memory.

16. The method of claim 12, further comprising:
starting the fans in each of the at least one fan modules sequentially to avoid power surges.

17. The method of claim 12, wherein managing performance comprises detecting with the microcontroller a locked rotor event when the measured rotational speed falls below the predefined target speed by at least a threshold amount.

18. The method of claim 2, wherein the one or more speed avoidance zones are stored and accessed by the microcontroller.

19. The method of claim 1, further comprising sensing a drop in voltage indicative of removal of power from the multi-phase motor and, based on the sensed drop in voltage, simultaneously energizing all one or more motor phases to stop the motor from rotating.

* * * * *